(12) United States Patent
Seo

(10) Patent No.: US 8,193,844 B2
(45) Date of Patent: Jun. 5, 2012

(54) SEMICONDUCTOR DEVICE AND METHOD FOR OPERATING THE SAME

(75) Inventor: Young-Suk Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 171 days.

(21) Appl. No.: 12/816,045

(22) Filed: Jun. 15, 2010

(65) Prior Publication Data

US 2011/0234278 A1    Sep. 29, 2011

(30) Foreign Application Priority Data

Mar. 29, 2010   (KR) ......................... 10-2010-0028145

(51) Int. Cl.
*H03L 7/06* (2006.01)
(52) U.S. Cl. ........................ 327/158; 327/149
(58) Field of Classification Search .................. 327/149, 327/158
See application file for complete search history.

(56) References Cited

U.S. PATENT DOCUMENTS

| | | | |
|---|---|---|---|
| 7,282,974 B2 * | 10/2007 | Lee | 327/158 |
| 7,317,341 B2 * | 1/2008 | Cho | 327/175 |
| 7,358,784 B2 * | 4/2008 | Kim et al. | 327/158 |
| 7,688,124 B2 * | 3/2010 | Choi | 327/158 |
| 7,768,327 B2 * | 8/2010 | Lee | 327/158 |
| 7,772,899 B2 * | 8/2010 | Choi | 327/158 |
| 7,830,185 B2 * | 11/2010 | Kim et al. | 327/158 |
| 7,876,139 B2 * | 1/2011 | Oh | 327/158 |
| 7,915,934 B2 * | 3/2011 | Ku | 327/158 |
| 7,920,001 B2 * | 4/2011 | Choi | 327/158 |
| 2006/0192602 A1 * | 8/2006 | Lee | 327/158 |
| 2007/0046347 A1 * | 3/2007 | Lee | 327/158 |
| 2007/0069781 A1 * | 3/2007 | Kim et al. | 327/158 |
| 2007/0069782 A1 * | 3/2007 | Shin | 327/158 |
| 2007/0080732 A1 * | 4/2007 | Cho | 327/175 |
| 2007/0176659 A1 * | 8/2007 | Gomm | 327/175 |
| 2008/0042705 A1 * | 2/2008 | Kim et al. | 327/158 |
| 2008/0191757 A1 * | 8/2008 | Choi | 327/149 |

(Continued)

FOREIGN PATENT DOCUMENTS

KR    1020100027267    3/2010

OTHER PUBLICATIONS

Notice of Allowance issued from Korean Intellectual Property Office on Oct. 31, 2011.

*Primary Examiner* — Lincoln Donovan
*Assistant Examiner* — Adam Houston
(74) *Attorney, Agent, or Firm* — IP & T Group LLP

(57) ABSTRACT

A semiconductor device includes an internal source clock generation unit configured to output first and second internal source clocks, a clock phase correction unit configured to correct a phase difference between the first and second internal source clocks according to a detection result, and to output first and second phase-corrected internal source clocks, a clock delay unit configured to delay the first and second phase-corrected internal source clocks and to generate first and second delay locked loop (DLL) clocks, and a clock output unit configured to mix phases of the first and second DLL clocks to output a DLL clock, and to output a feedback clock to reflect an actual delay condition of an external source clock path in the first or second DLL clock.

39 Claims, 8 Drawing Sheets

U.S. PATENT DOCUMENTS

| | | | |
|---|---|---|---|
| 2009/0058481 A1* | 3/2009 | Kim et al. | 327/175 |
| 2010/0073053 A1* | 3/2010 | Shin | 327/158 |
| 2010/0195423 A1* | 8/2010 | Oh | 365/194 |
| 2010/0201414 A1* | 8/2010 | Oh | 327/158 |
| 2010/0271087 A1* | 10/2010 | Choi | 327/149 |
| 2011/0234278 A1* | 9/2011 | Seo | 327/158 |
| 2011/0298504 A1* | 12/2011 | Becker et al. | 327/149 |

* cited by examiner

SEMICONDUCTOR DEVICE AND METHOD FOR OPERATING THE SAME

CROSS-REFERENCE TO RELATED APPLICATIONS

The present application claims priority of Korean Patent Application No. 10-2010-0028145, filed on Mar. 29, 2010, which is incorporated herein by reference in its entirety.

BACKGROUND OF THE INVENTION

Exemplary embodiments of the present invention relate to a semiconductor design technology, and more particularly, to a delay locked loop (DLL) circuit and a duty cycle correction (DCC) circuit of a semiconductor device.

A synchronous semiconductor memory device such as a double data rate synchronous DRAM (DDR SDRAM) is designed to transfer data to external devices in synchronization with an external clock signal inputted from an external device such as a memory controller.

In order to stably transfer data between the memory device and external devices, e.g., the memory controller, it is desirable that the data are outputted from the memory device in synchronization with the external clock applied from the external device to the memory device.

The memory device generates and uses the internal clock signal synchronized with the external clock signal for the stable data transfer. However, the internal clock signal may be out of synchronization with the external clock signal when it is transferred to an output circuit of the data, because it is delayed while passing through internal components of the memory device.

Therefore, in order to stably transfer the data outputted from the memory device, the internal clock signal which is delayed while passing through the internal components of the memory device should be synchronized with the external clock signal by inversely compensating the time at which the data is loaded on the bus, in order to accurately match with the edge or center of the external clock signal applied from the external device.

Examples of such a clock synchronization circuit include a phase locked loop (PLL) circuit and a delay locked loop (DLL) circuit. When frequencies of the external clock signal and the internal clock signal are different from each other, a PLL circuit is used because a frequency multiplication function is needed. On the other hand, when frequencies of the external clock signal and the internal clock signal are equal to each other, a DLL circuit is used because it is less influenced by noise and can be implemented in a relatively small area, as compared to the PLL circuit. For example, in the case of the synchronous semiconductor memory device such as a DDR SDRAM, the frequencies of the external clock signal and the internal clock signal are equal to each other, and thus, the DLL circuit is used as the clock synchronization circuit.

Meanwhile, a synchronous semiconductor memory device such as a DDR SDRAM performs a data input/output operation at rising and falling edges of an internal clock signal. In this case, a duty cycle of the internal clock signal is an important factor which can maximally maintain a timing margin of a high-performance memory system.

That is, when the duty cycle of the internal clock signal does not maintain 50%, an error corresponding to an offset out of 50% reduces the timing margin of the high-performance memory system. Therefore, there is a need for an apparatus for compensating for distortion of the duty cycle which is caused by process, voltage, and temperature (PVT) variations. A duty cycle correction (DCC) circuit used in a DLL circuit is a circuit which corrects the duty cycle of the internal clock signal.

FIG. 1 is a block diagram illustrating a DLL circuit and a DCC circuit of a conventional semiconductor device.

Referring to FIG. 1, the DLL circuit of the conventional semiconductor device includes a first clock phase comparison unit (1st PD) 10, a second clock phase comparison unit (2nd PD) 20, a first delay control unit 30, a second delay control unit 40, a first variable delay line 50, a second variable delay line 60, a first delay model unit (1st REPLICA) 70, and a second delay model unit (2nd REPLICA) 80. Specifically, the first clock phase comparison unit 10 is configured to compare a phase of a source clock REFCLK with a phase of a first feedback clock FBCLK1 and generate a first phase comparison signal PD_OUT1. The second clock phase comparison unit 20 is configured to compare the phase of the source clock REFCLK with a phase of a second feedback clock FBCLK2 and generate a second phase comparison signal PD_OUT2. The first delay control unit 30 is configured to generate a first delay control signal DLY_CONT1 whose value is varied in response to the first phase comparison signal PD_OUT1. The second delay control unit 40 is configured to generate a second delay control signal DLY_CONT2 whose value is varied in response to the second phase comparison signal PD_OUT2. The first variable delay line 50 is configured to output a first DLL clock DLLCLK1 by reflecting a delay amount, which corresponds to the first delay control signal DLY_CONT1, in the source clock REFCLK. The second variable delay line 60 is configured to output a second DLL clock DLLCLK2 by reflecting a delay amount, which corresponds to the is second delay control signal DLY_CONT2, in a clock generated by inverting the phase of the source clock REFCLK. The first delay model unit 70 is configured to generate the first feedback clock FBCLK1 to reflect an actual delay condition of the source clock REFCLK path in the first DLL clock DLLCLK1. The second delay model unit 70 is configured to generate the second feedback clock FBCLK2 to reflect the actual delay condition of the source clock REFCLK path in the second DLL clock DLLCLK2.

Also, referring to FIG. 1, the DCC circuit of the conventional semiconductor device includes a phase mixer 90 configured to mix phases of the first and second DLL clocks DLLCLK1 and DLLCLK2 outputted from the DLL circuit, and output a duty-corrected DLL clock DCC_DLLCLK.

FIG. 2 is a diagram illustrating the operations of the DLL circuit and the DCC circuit of the conventional semiconductor device shown in FIG. 1.

Specifically, FIG. 2 is a waveform diagram of input/output signals when the operations of the DLL circuit and the DCC circuit of the conventional semiconductor device of FIG. 1 are completed.

Referring to FIG. 2, the rising edges of the first feedback clock FBCLK1, the second feedback clock FBCLK2, the first DLL clock DLLCLK1, the second DLL clock DLLCLK2, and the duty-corrected DLL clock DCC_DLLCLK are synchronized with the rising edge of the source clock REFCLK.

At this time, the activation and deactivation durations of the first feedback clock FBCLK1 and the first DLL clock DLLCLK1 are opposite to those of the second feedback clock FBCLK2 and the second DLL clock DLLCLK2. This phenomenon occurs while the phases of the clocks are changed through the operation of the DLL circuit.

Furthermore, the duty-corrected DLL clock DCC_DLLCLK having the duty cycle ratio of 50% can be obtained by mixing the phases of the first DLL clock DLLCLK1 and the second DLL clock DLLCLK2 which are opposite in the activation and deactivation duration length.

As such, in the conventional semiconductor device, the activation and deactivation durations of the first DLL clock DLLCLK1 and the second DLL clock DLLCLK2 are set to be opposite to each other through the operation of the DLLL circuit, and the phases of the first DLL clock DLLCLK1 and the second DLL clock DLLCLK2 are mixed to thereby generate the duty-corrected DLL clock DCC_DLLCLK having the duty cycle ratio of 50%.

However, in order to perform the above-described operation, as illustrated in FIG. 1, the conventional semiconductor device must be designed to include a clock path for a clock corresponding to the rising edge of the source clock REFCLK and a separate clock path for a clock corresponding to the falling edge of the source clock REFCLK.

Since the DLL circuit and the DCC circuit having the configuration of FIG. 1 have two clock paths, more power is dissipated as the frequency of the inputted source clock REFCLK becomes higher and switching increases.

Moreover, a large circuit area is required because two separate sets of components performing similar operations are provided for each unit in order to maintain the two clock paths.

SUMMARY OF THE INVENTION

Exemplary embodiments of the present invention are directed to a DLL circuit and a DCC circuit of a semiconductor device, which operate with minimum power dissipation even when an external source clock having a high frequency is applied thereto.

In accordance with an exemplary embodiment of the present invention, a semiconductor device includes: an internal source clock generation unit configured to divide a frequency of an external source clock by a certain ratio, and to output first and second internal source clocks corresponding to first and second edges of the external source clock; a clock phase correction unit configured to detect a duration in which the first and second internal source clocks have a same logic level, correct a phase difference between the first and second internal source clocks according to a detection result, and output first and second phase-corrected internal source clocks; a clock delay unit configured to delay the first and second phase-corrected internal source clocks by a delay amount corresponding to a phase difference between the first and second phase-corrected internal source clocks and a feedback clock, and generate first and second delay locked loop (DLL) clocks; and a clock output unit configured to mix phases of the first and second DLL clocks to output a final DLL clock, and to output the feedback clock to reflect an actual delay condition of an external source clock path in the first or second DLL clock.

In accordance with another exemplary embodiment of the present invention, a semiconductor device includes: a phase correction unit configured to divide frequencies of first and second internal source clocks corresponding to first and second edges of an external source clock by two, and perform a phase correction operation so that the first and second internal source clocks have a 90-degree phase difference; a clock delay unit configured to generate first and second delay locked loop (DLL) clocks by delaying the first and second internal source clocks by a delay amount corresponding to a phase difference between the first or second internal source clock and a feedback clock; and a clock output unit configured to output a final DLL clock by dividing a period of the first DLL clock by two, or by dividing a period of the second DLL clock by two, and output the feedback clock to reflect an actual delay condition of an external source clock path in the first or second DLL clock.

In accordance with yet another exemplary embodiment of the present invention, a method for operating a semiconductor device includes: dividing a frequency of a clock corresponding to a first edge of an external source clock at a certain ratio, and outputting a first internal source clock; dividing a frequency of a clock corresponding to a second edge of the external source clock at the certain ratio, and outputting a second internal source clock; correcting a phase of the first or second internal source clock so that a length of a first duration in which the first and second internal source clocks have a same logic level is equal to a length of a second duration in which the first and second internal source clocks have different logic levels; generating first and second delay locked loop (DLL) clocks by delaying the first and second internal source clocks by a delay amount corresponding to a phase difference between the first or second internal source clock and a feedback clock; generating a final DLL clock whose logic level transition timing is determined corresponding to edges of the first and second DLL clocks; and outputting the feedback clock to reflect an actual delay condition of an external source clock path in the first or second DLL clock.

In accordance with still another exemplary embodiment of the present invention, a semiconductor device includes: a delay locked loop (DLL) operation unit configured to divide frequencies of first and second internal source clocks corresponding to first and second edges of an external source clock by two, perform a phase correction operation so that first and second frequency-divided internal source clocks have a 90-degree phase difference, and delay first and second phase-corrected internal source clocks by a variable delay amount corresponding to a DLL control signal; and a DLL operation control unit configured to output a DLL clock by dividing periods of first and second variably-delayed internal source clocks by two, and adjust a value of the DLL control signal according to a phase difference between a feedback clock and the first or second phase-corrected internal source clock, the feedback clock being generated to reflect an actual delay condition of an external source clock path in the first or second variably-delayed internal source clock.

In accordance with still another exemplary embodiment of the present invention, a semiconductor device includes: an internal source clock generation unit configured to generate first and second internal source clocks; a clock phase correction unit configured to correct a phase difference between the first and second internal source clocks, and to output first and second phase-corrected internal source clocks; a clock delay unit configured to delay the first and second phase-corrected internal source clocks and to generate first and second delay locked loop (DLL) clocks; and a clock output unit configured to mix phases of the first and second DLL clocks to output a final DLL clock, and to output a feedback clock to reflect an actual delay condition of an external source clock path in the first or second DLL clock.

In accordance with still another exemplary embodiment of the present invention, a semiconductor device includes: a clock generation unit configured to generate internal source clocks having a certain phase difference by correcting a duty cycle ratio of an external source clock; a clock delay unit configured to delay the internal source clocks based on a comparison result of the internal source clocks and a feedback clock to generate delay locked loop (DLL) clocks maintained in the certain phase difference; and a clock output unit configured to output a final DLL clock by mixing the DLL clocks and to output the feedback clock to reflect an actual delay condition of an external source clock path in the DLL clocks.

DESCRIPTION OF SPECIFIC EMBODIMENTS

Figure 1:
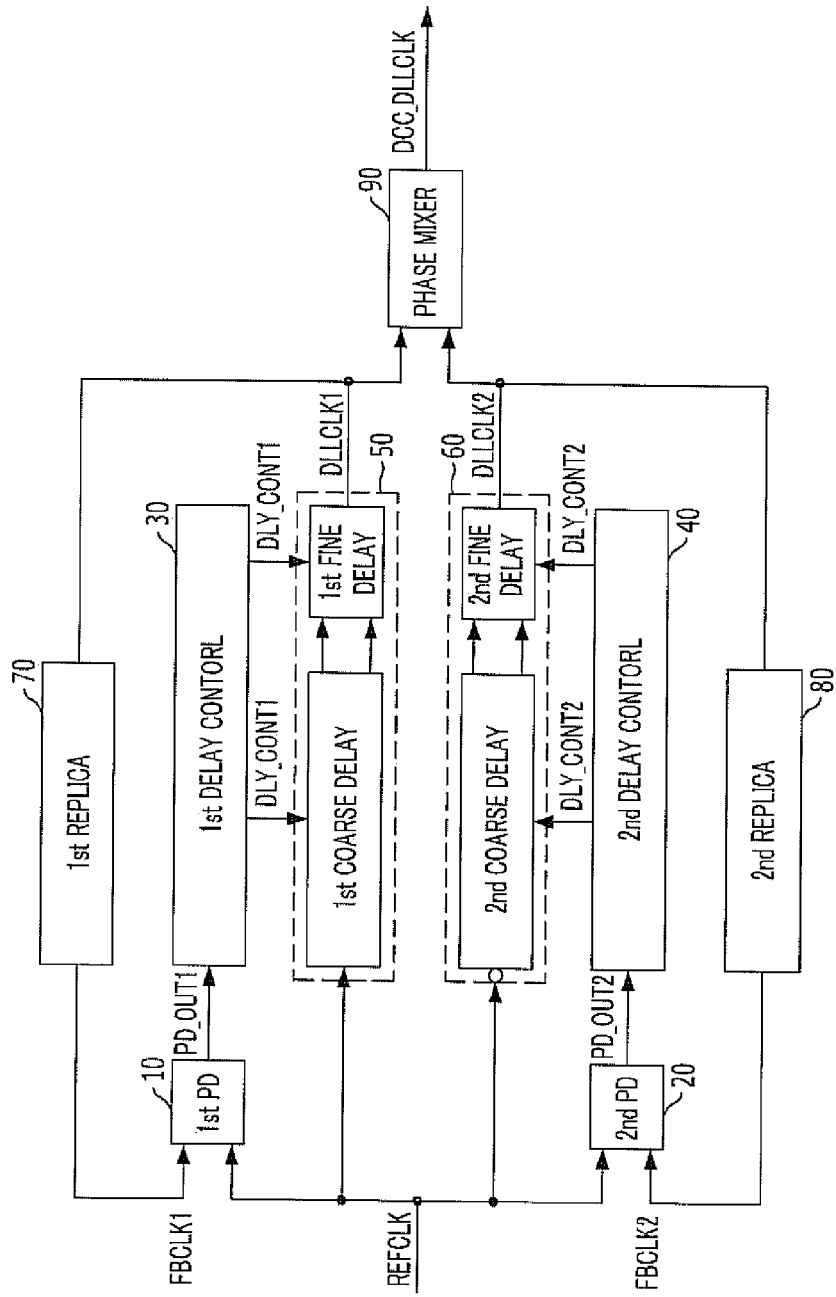
FIG. 1 is a block diagram illustrating a DLL circuit and a DCC circuit of a conventional semiconductor device.
Figure 2:
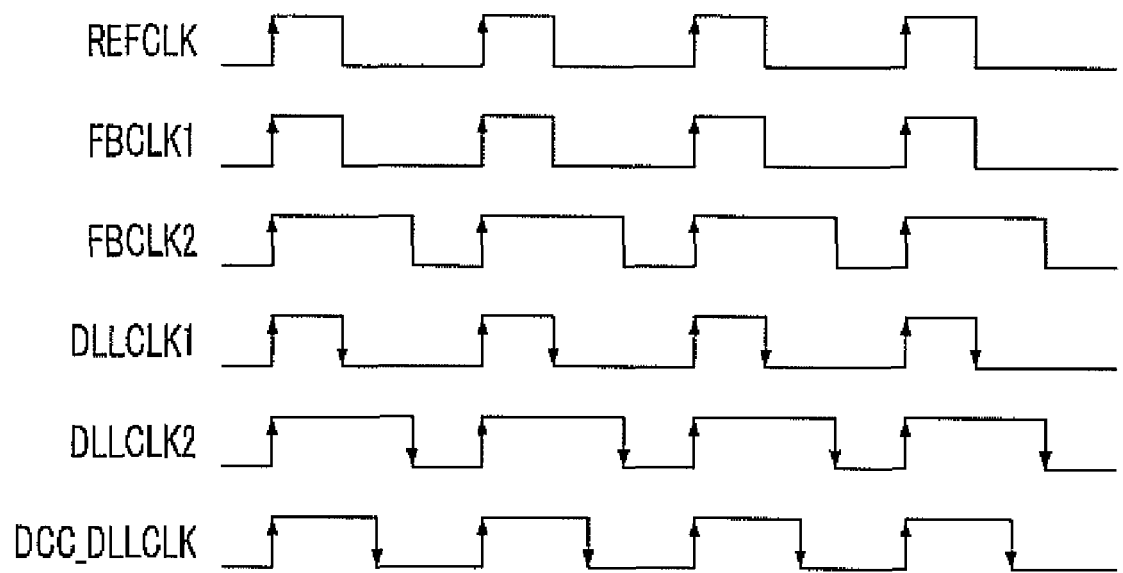
FIG. 2 is a diagram illustrating the operations of the DLL circuit and the DCC circuit of the conventional semiconductor device shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
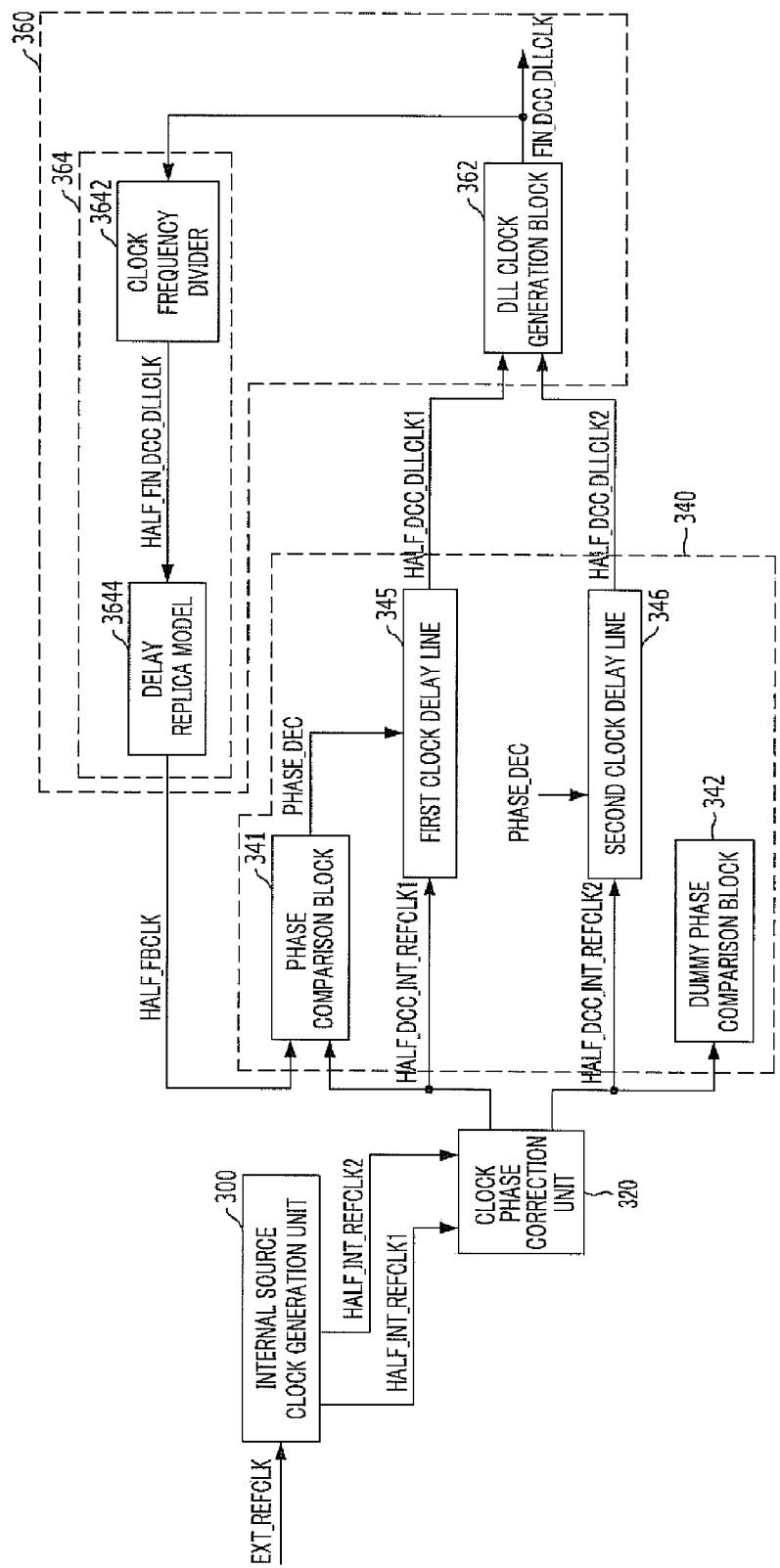
FIG. 3 is a block diagram of a DLL circuit and a DCC circuit of a semiconductor device in accordance with an exemplary embodiment of the present invention.

FIG. 3 is a block diagram of a DLL circuit and a DCC circuit of a semiconductor device in accordance with an exemplary embodiment of the present invention.

Referring to FIG. 3, the semiconductor device in accordance with the embodiment of the present invention includes an internal source clock generation unit 300, a clock phase correction unit 320, a clock delay unit 340, and a clock output unit 360. The internal source clock generation unit 300 is configured to divide frequencies of clocks INT_REFCLK1 and INT_REFCLK2 corresponding to first and second edges of an external source clock EXT_REFCLK at a certain ratio, and generate a first internal source clock HALF_INT_REFCLK1 and a second internal source clock HALF_INTREFCLK2. The clock phase correction unit 320 is configured to detect a duration in which the first internal source clock HALF_INT_REFCLK1 and the second internal source clock HALF_INT_REFCLK2 have the same logic low or high level, correct a phase difference between the first internal source clock HALF_INT_REFCLK1 and the second internal source clock HALF_INT_REFCLK2 according to the detection result, and output first and second phase-corrected internal source clocks HALF_DCC_INT_REFCLK1 and HALF_DCC_INT_REFCLK2. The clock delay unit 340 is configured to delay the first and second phase-corrected internal source clocks HALFDCC_INT_REFCLK1 and HALF_DCC_INT_REFCLK2 outputted from the clock phase correction unit 320 by a delay amount corresponding to a phase difference between the first or second phase-corrected internal source clock HALF_DCC_INT_REFCLK1 or HALF_DCC_INT_REFCLK2 and a feedback clock HALF_FBCLK, and generate first and second DLL clocks HALF_DCC_DLLCLK1 and HALF_DCC_DLLCLK2. The clock output unit 360 is configured to output a final DLL clock FIN_DCC_DLLCLK by mixing phases of the first and second DLL clocks HALF_DCC_DLLCLK1 and HALF_DCC_DLLCLK2, and output the feedback clock HALF_FBCLK to reflect an actual delay condition of an external source clock (EXT_REFCLK) path in the first DLL clock HALF_DCC_DLLCLK1 or the second DLL clock HALF_DCC_DLLCLK2.

The clock delay unit 340 includes a phase comparison block 341, a first clock delay line 345, and a second clock delay line 346. Specifically, the phase comparison block 341 is configured to compare a phase of the first or second phase-corrected internal source clock HALF_DCC_INT_REFCLK1 or HALF_DCC_INT_REFCLK2 with a phase of the feedback clock HALF_FBCLK. As shown in FIG. 3, for example, the phase comparison block 341 compares a phase of the first phase-corrected internal source clock HALF_DCC_INT_REFCLK1 with a phase of the feedback clock HALF_FBCLK. The first clock delay line 345 is configured to generate the first DLL clock HALF_DCC_DLLCLK1 by delaying the first phase-corrected internal source clock HALF_DCC_INT_REFCLK1 outputted from the clock phase correction unit 320 by a delay amount which varies depending on an output signal PHASE_DEC of the phase comparison block 341. The second clock delay line 346 is configured to generate the second DLL clock HALF_DCC_DLLCLK2 by delaying the second phase-corrected internal source clock HALF_DCC_INT_REFCLK2 by a delay amount which varies depending on the output signal PHASE_DEC of the phase comparison block 341. Also, the clock delay unit 340 further includes a dummy phase comparison block 342 having the same load with respect to the clock phase correction unit 320 as the phase comparison block 341. The dummy phase is coupled to an output terminal of the second phase-corrected internal source clock HALF_DCC_INT_REFCLK2 when the phase comparison block 341 performs the operation of comparing the phase of the first phase-corrected internal source clock HALF_DCC_INT_REFCLK1 with the phase of the feedback clock HALF_FBCLK, and is coupled to an output terminal of the first phase-corrected internal source clock HALF_DCC_INT_REFCLK1 when the phase comparison block 341 performs the operation of comparing the phase of the second phase-corrected internal source clock HALF_DCC_INT_REFCLK2 with the phase of the feedback clock HALF_FBCLK. In either case, the dummy phase comparison block 342 is configured to apply the same load to the output terminals of the first or second phase-corrected internal source clocks HALF_DCC_INT_REFCLK1 and HALF_DCC_INT_REFCLK2, as that of the phase comparison block 341.

For sake of convenience, the clock output unit 360 is described with reference to two main types of configuration, although other configurations may be recognized.

First, the clock output unit 360 may be configured as illustrated in FIG. 3. Specifically, the clock output unit 360 includes a DLL clock generation block 362 and a feedback clock generation block 364. The DLL clock generation block 362 is configured to generate the final DLL clock FIN_DCC_DLLCLK whose logic level transition timing is determined according to the duration in which the first DLL clock HALF_DCC_DLLCLK1 and the second DLL clock HALF_DCC_DLLCLK2 have the same logic level and the duration in which the first DLL clock HALF_DCC_DLLCLK1 and the second DLL clock HALF_DCC_DLLCLK2 do not have the same logic level. The feedback clock generation block 364 is configured to generate the feedback clock HALF_FBCLK to reflect the actual delay condition of the external source clock (EXT_REFCLK) path in a divided final clock HALF_FIN_DCC_DLLCLK generated by dividing the frequency of the final DLL clock FIN_DCC_DLLCLK, in which the phases of the first DLL clock HALF_DCC_DLLCLK1 and the second DLL clock HALF_DCC_DLLCLK2 are mixed, according to a certain ratio.

Also, the clock output unit 360 may have a different configuration from that of FIG. 3. Specifically, the clock output unit 360 may include a DLL clock generation block 362 and a feedback clock generation block. The DLL clock generation block 362 is configured to generate the final DLL clock FIN_DCC_DLLCLK whose logic level transition timing is determined according to the duration in which the first DLL clock HALF_DCC_DLLCLK1 and the second DLL clock HALF_DCC_DLLCLK2 have the same logic level and the duration in which the first DLL clock HALF_DCC_DLLCLK1 and the second DLL clock HALF_DCC_DLLCLK2 do not have the same logic level. The feedback clock generation block is configured to generate the feedback clock HALF_FBCLK to reflect the actual delay condition of the external source clock (EXT_REFCLK) path in one of the first DLL clock HALF_DCC_DLLCLK1 and the second DLL clock HALF_DCC_DLLCLK2.

The feedback clock generation block 364 having the configuration of FIG. 3 includes a clock frequency divider 3642 and a delay replica model 3644. The clock frequency divider 3642 is configured to divide the frequency of the final DLL clock FIN_DCC_DLLCLK, where the phases of the first DLL clock HALF_DCC_DLLCLK1 and the second DLL clock HALF_DCC_DLLCLK2 are mixed, according to a certain ratio. The delay replica model 3644 is configured to output the feedback clock HALF_FBCLK to reflect the actual delay condition of the external source clock (EXT_REFCLK) path in the output clock HALF_FIN_DCC_DLLCLK of the clock frequency divider 3642.

On the other hand, the feedback clock generation block having a different configuration as that of FIG. 3 need not include the clock frequency divider 3642 because the first DLL clock HALF_DCC_DLLCLK1 or the second DLL clock HALF_DCC_DLLCLK2 outputted from the clock delay unit 340 may be used as is. The feedback clock generation block may only include a delay replica model configured to generate the feedback clock HALF_FBCLK to reflect the actual delay condition of the external source clock (EXT_REFCLK) path in the first DLL clock HALF_DCC_DLLCLK1 or the second DLL clock HALF_DCC_DLLCLK2.

An operation of the semiconductor device in accordance with an exemplary embodiment of the present invention will be described below.

First, the internal source clock generation unit 300 is provided to stably perform the DLL operation and the DCC operation even though the frequency of the external source clock EXT_REFCLK may be high.

Specifically, the internal source clock generation unit 300 generates the first internal source clock HALF_INT_REFCLK1 by dividing the frequency of the external source clock EXT_REFCLK according to a certain ratio, in response to the first edge of the external source clock EXT_REFCLK. The first edge of the external source clock EXT_REFCLK is generally a rising edge, but may also be a falling edge according to a designer's choice. The internal source clock generation unit 300 generates the second internal source clock HALF_INT_REFCLK2 by dividing the frequency of the external source clock EXT_REFCLK according to a certain ratio, in response to the second edge of the external source clock EXT_REFCLK. The second edge of the external source clock EXT_REFCLK is generally a falling edge, but may also be a rising edge according to a designer's choice.

For convenience, it is assumed in this exemplary embodiment that the internal source clock generation unit 300 divides the frequency of the external source clock EXT_REFCLK by two for generating a first internal source clock HALF_INT_REFCLK1 and a second internal source clock HALF_INT_REFCLK2. The frequency of the external source clock EXT_REFCLK may also be divided by a greater ratio, for example, four or eight, according to a designer's choice.

The clock phase correction unit 320 is provided to correct a duty cycle ratio of the external source clock EXT_REFCLK.

Specifically, the clock phase correction unit 320 performs an operation of controlling the first internal source clock HALF_INT_REFCLK1 and the second internal source clock HALF_INT_REFCLK2 outputted from the internal source clock generation unit 300 to have a certain phase difference (e.g., a 90-degree phase difference).

For example, the rising edge of the first internal source clock HALF_INT_REFCLK1 may correspond to the rising edge of the external source clock EXT_REFCLK, and the rising edge of the second internal source clock HALF_INT_REFCLK2 may correspond to the falling edge of the external source clock EXT_REFCLK. Also, the frequencies of the first internal source clock HALF_INT_REFCLK1 and the second internal source clock HALF_INT_REFCLK2 are determined by dividing the frequency of the external source clock EXT_REFCLK by two. Thus, if the duty cycle ratio of the external source clock EXT_REFCLK is 50%, the phase difference between the first internal source clock HALF_INT_REFCLK1 and the second internal source clock HALF_INT_REFCLK2 becomes 90 degrees.

However, it is highly likely that the duty cycle ratio of the external source clock EXT_REFCLK is not 50%, so that the phase difference between the first internal source clock HALF_INT_REFCLK1 and the second internal source clock HALF_INT_REFCLK2 will not become 90 degrees even though the internal source clock generation unit 300 receives the external source clock EXT_REFCLK and generates the first internal source clock HALF_INT_REFCLK1 and the second internal source clock HALF_INT_REFCLK2.

Therefore, the operation of controlling the first internal source clock HALF_INT_REFCLK1 and the second internal source clock HALF_INT_REFCLK2 to have a certain phase difference (e.g., a 90-degree phase difference) may be the same as an operation of inputting an external source clock EXT_REFCLK with a certain duty cycle ratio.

In accordance with an exemplary embodiment of the present invention, in order to obtain a 90-degree phase difference between the first internal source clock HALF_INT_REFCLK1 and the second internal source clock HALF_INT_REFCLK2, the length of the duration in which the first internal source clock HALF_INT_REFCLK1 and the second internal source clock HALF_INT_REFCLK2 have the same logic level is controlled such that it equals the length of the duration in which the first internal source clock HALF_INT_REFCLK1 and the second internal source clock HALF_INT_REFCLK2 do not have the same logic level.

For example, when it is determined that the length of the duration in which the first internal source clock HALF_INT_REFCLK1 and the second internal source clock HALF_INT_REFCLK2 do not have the same logic level is longer than the length of the duration in which the first internal source clock HALF_INT_REFCLK1 and the second internal source clock HALF_INT_REFCLK2 have the same logic level, the phase of the first internal source clock HALF_INT_REFCLK1 is increased while the phase of the second internal source clock HALF_INT_REFCLK2 is maintained as is, or the phase of the second internal source clock HALF_INT_REFCLK2 is decreased while the phase of the first internal source clock HALF_INT_REFCLK1 is maintained as is, or the phase of the first internal source clock HALF_INT_REFCLK1 is increased and simultaneously the phase of the second internal source clock HALF_INT_REFCLK2 is decreased.

On the other hand, when it is determined that the length of the duration in which the first internal source clock HALF_INT_REFCLK1 and the second internal source clock HALF_INT_REFCLK2 have the same logic level is longer than the length of the duration in which the first internal source clock HALF_INT_REFCLK1 and the second internal source clock HALF_INT_REFCLK2 do not have the same logic level, the phase of the first internal source clock HALF_INT_REFCLK1 is decreased while the second internal source clock HALF_INT_REFCLK2 is maintained as is, or the delay of the second internal source clock HALF_INT_REFCLK2 is increased while the first internal source clock HALF_INT_REFCLK1 is maintained as is, or the delay of the first internal source clock HALF_INT_REFCLK1 is decreased and simultaneously the delay of the second internal source clock HALF_INT_REFCLK2 is increased.

The clock delay unit 340 performs the DLL operation so that the first phase-corrected internal source clock HALF_DCC_INT_REFCLK1 and the second phase-corrected internal source clock HALF_DCC_INT_REFCLK2 outputted from the clock phase correction unit 320 maintain the same phase difference. That is, when the delay amount, corresponding to the actual delay condition of the external source clock (EXT_REFCLK) path, is applied to the first phase-corrected internal source clock HALF_DCC_INT_REFCLK1 and the second phase-corrected internal source clock HALF_DCC_INT_REFCLK2, the first DLL clock HALF_DCC_DLLCLK1 and the second DLL clock HALF_DCC_DLLCLK2 can have the same phase difference as the phase difference of the first phase-corrected internal source clock HALF_DCC_INT_REFCLK1 and the second phase-corrected internal source clock HALF_DCC_INT_REFCLK2.

Specifically, the first phase-corrected internal source clock HALF_DCC_INT_REFCLK1 and the second phase-corrected internal source clock HALF_DCC_INT_REFCLK2 outputted from the clock phase correction unit 320 are delayed by the same delay amount and outputted as the first DLL clock HALF_DCC_DLLCLK1 and the second DLL clock HALF_DCC_DLLCLK2, in response to the phase comparison result of the first phase-corrected internal source clock HALF_DCC_INT_REFCLK1 or the second phase-corrected internal source clock HALF_DCC_INT_REFCLK2 and the feedback clock HALF_FBCLK. That is, in the operation of the clock delay unit 340 in accordance with an exemplary embodiment of the present invention, the first DLL clock HALF_DCC_DLLCLK1 and the second DLL clock HALF_DCC_DLLCLK2 are outputted by simultaneously delaying the first phase-corrected internal source clock HALF_DCC_INT_REFCLK1 and the second phase-corrected internal source clock HALF_DCC_INT_REFCLK2, having a certain phase difference, according to the operation result PHASE_DEC of the single phase comparison block 341.

Therefore, when the phase of the feedback clock HALF_FBCLK leads the phase of the first phase-corrected internal source clock HALF_DCC_INT_REFCLK1 or the second phase-corrected internal source clock HALF_DCC_INT_REFCLK2, the phase comparison block 341 controls the value of the output signal PHASE_DEC so that the delay amounts of the first clock delay line 345 and the second clock delay line 346 are decreased to thereby generate the first DLL clock HALF_DCC_DLLCLK1 and the second DLL clock HALF_DCC_DLLCLK2 whose phases lead the phases of the first phase-corrected internal source clock HALF_DCC_INT_REFCLK1 and the second phase-corrected internal source clock HALFDCC_INT_REFCLK2. On the other hand, when the phase of the feedback clock HALF_FBCLK lags behind the phase of the first phase-corrected internal source clock HALF_DCC_INT_REFCLK1 or the second phase-corrected internal source clock HALF_DCC_INT_REFCLK2, the phase comparison block 341 controls the value of the output signal PHASE_DEC so that the delay amounts of the first clock delay line 345 and the second clock delay line 346 are increased to thereby generate the first DLL clock HALF_DCC_DLLCLK1 and the second DLL clock HALF_DCC_DLLCLK2 whose phases lag behind the phases of the first phase-corrected internal source clock HALF_DCC_INT_REFCLK1 and the second phase-corrected internal source clock HALF_DCC_INT_REFCLK2.

The DLL clock generation block 362 included in the clock output unit 360 divides the period of the first DLL clock HALF_DCC_DLLCLK1 by a certain ratio according to the edge of the second DLL clock HALF_DCC_DLLCLK2 and generates the final DLL clock FIN_DCC_DLLCLK having the same frequency as that of the external source clock EXT_REFCLK, or divides the period of the second DLL clock HALF_DCC_DLLCLK2 by a certain ratio according to the edge of the first DLL clock HALF_DCC_DLLCLK1 and generates the final DLL clock FIN_DCC_DLLCLK having the same frequency as that of the external source clock EXT_REFCLK.

Since it has been described above that the internal source clock generation unit 300 generates the first internal source clock HALF_INT_REFCLK1 and the second internal source clock HALF_INT_REFCLK2 by dividing the frequency of the external source clock EXT_REFCLK by two, the DLL clock generation block 362 included in the clock output unit 360 also generates the final DLL clock FIN_DCC_DLLCLK by dividing the period of the first DLL clock HALF_DCC_DLLCLK1 by two according to the edge of the second DLL clock HALF_DCC_DLLCLK2. However, the period of the clock may also be divided by a greater ratio, for example, four or eight, according to a designer's choice.

In this exemplary embodiment of the present invention, the frequency of the external source clock EXT_REFCLK is divided by two to generate the first internal source clock HALF_INT_REFCLK1 and the second internal source clock HALF_INT_REFCLK2 having frequencies two times less than that of the external source clock EXT_REFCLK. The period of the first DLL clock HALF_DCC_DLLCLK1 is divided by two according to the edge of the second DLL clock HALF_DCC_DLLCLK2 to generate the final DLL clock FIN_DCC_DLLCLK having a frequency two times greater than those of the first DLL clock HALF_DCC_DLLCLK1 and the second DLL clock HALF_DCC_DLLCLK2.

Specifically, the DLL clock generation block 362 included in the clock output unit 360 may generate the final DLL clock FIN_DCC_DLLCLK having the same frequency as that of the external source clock EXT_REFCLK by activating the final DLL clock FIN_DCC_DLLCLK at the rising edge and the falling edge of the first DLL clock HALF_DCC_DLLCLK1 and deactivating the final DLL clock FIN_DCC_DLLCLK at the rising edge and the falling edge of the second DLL clock HALF_DCC_DLLCLK2, or by activating the final DLL clock FIN_DCC_DLLCLK at the rising edge and the falling edge of the second DLL clock HALF_DCC_DLLCLK2 and deactivating the final DLL clock FIN_DCC_DLLCLK at the rising edge and the falling edge of the first DLL clock HALFDCC_DLLCLK1.

When the feedback clock generation block 364 operates upon reception of the final DLL clock FIN_DCC_DLLCLK, the feedback clock generation block 364 divides the frequency of the final DLL clock FIN_DCC_DLLCLK by two to generate the clock HALF_FIN_DCC_DLLCLK having a frequency two times less than that of the final DLL clock FIN_DCC_DLLCLK, and outputs the feedback clock HALF_FBCLK to reflect the actual delay condition of the external source clock (EXT_REFCLK) path in the divided final clock HALF_FIN_DCC_DLLCLK.

However, when the feedback clock generation block 364 operates upon reception of the first DLL clock HALF_DCC_DLLCLK1 or the second DLL clock HALF_DCC_DLLCLK2, the feedback clock generation block 364 outputs the feedback clock HALF_FBCLK to reflect the actual delay condition of the external source clock (EXT_REFCLK) path in the first DLL clock HALF_DCC_DLLCLK1 or the second DLL clock HALF_DCC_DLLCLK2.

Figure 4:
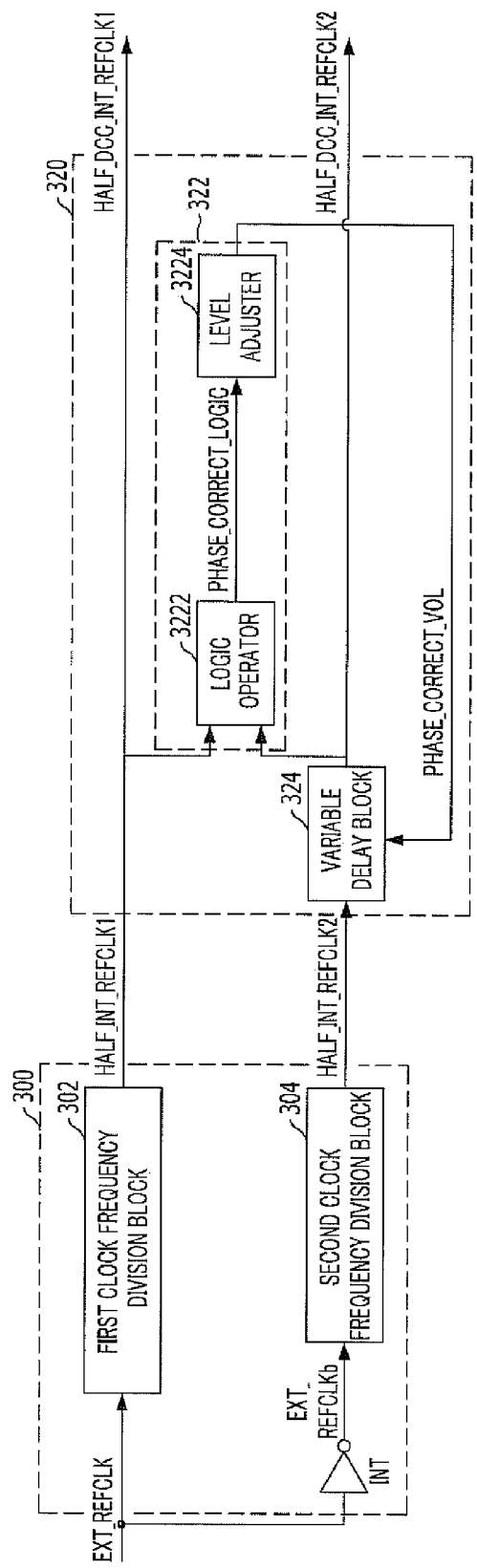
FIG. 4 is a block diagram of an internal source clock generation unit and a clock phase correction unit included in the semiconductor device illustrated in FIG. 3 in accordance with an exemplary embodiment of the present invention.

FIG. 4 is a block diagram of the internal source clock generation unit 300 and the clock phase correction unit 320 included in the semiconductor device illustrated in FIG. 3 in accordance with an exemplary embodiment of the present invention.

Referring to FIG. 4, the internal source clock generation unit 300 may include a first clock frequency division block 302 and a second clock frequency division block 304. Specifically, the first clock frequency division block 302 is configured to divide the frequency of the external source clock EXT_REFCLK by a certain ratio and generate the first internal source clock HALF_INT_REFCLK1. The second clock frequency division block 304 is configured to divide the frequency of the clock EXT_REFCLKb, which is generated by inverting the phase of the external source clock EXT_REFCLK, by a certain ratio and generate the second internal source clock HALF_INT_REFCLK2.

That is, the external source clock EXT_REFCLK is directly applied to the first clock frequency division block 302, and the phase-inverted external source clock EXT_REFCLKb obtained by inverting the external source clock EXT_REFCLK through an inverter INT is applied to the second clock frequency division block 304. In such a configuration, the phase-inverted external source clock EXT_REFCLKb may not be an exact inverted version of the external source clock EXT_REFCLK due to a slight variation of the inverter INT. This may be true even where the external source clock EXT_REFCLK having a duty cycle ratio of 50% is inputted. To prevent this phenomenon, the external source clock EXT_REFCLK may be passed through two inverters to maintain its phase, before being applied to the first clock frequency division block 302, while the phase-inverted external source clock EXT_REFCLKb, which has passed through one inverter, and thus, has an inverted phase, may be applied to the second clock frequency division block 304.

The clock phase correction unit 320 may include a level detection block 322 and a variable delay block 324. The level detection block 322 is configured to detect the duration in which the first internal source clock HALF_INT_REFCLK1 and the second internal source clock HALF_INT_REFCLK2 have the same logic level, and change the level of a phase correction control voltage PHASE_CORRECT_VOL in response to a detection result PHASE_CORRECT_LOGIC. The variable delay block 324 is configured to delay the first internal source clock HALF_INT_REFCLK1 or the second internal source clock HALF_INT_REFCLK2 by a delay amount which varies according to the level change of the phase correction control voltage PHASE_CORRECT_VOL.

The level detection block 322 includes a logic operator 3222 and a level adjuster 3224. The logic operator 3222 is configured to receive the first internal source clock HALF_INT_REFCLK1 through a first input terminal and the second internal source clock HALF_INT_REFCLK2 through a second input terminal, and perform an exclusive OR operation on the first internal source clock HALF_INT_REFCLK1 and the second internal source clock HALF_INT_REFCLK2. The level adjuster 3224 is configured to adjust the voltage level of the phase correction control voltage in PHASE_CORRECT_VOL according to the logic level change of a signal PHASE_CORRECT_LOGIC outputted from the logic operator 3222.

The logic operator 3222 included in the level detection block 322 outputs the signal PHASE_CORRECT_LOGIC which is deactivated for the duration in which the first internal source clock HALF_INT_REFCLK1 and the second internal source clock HALF_INT_REFCLK2 have the same logic level, and outputs the signal PHASE_CORRECT_LOGIC which is activated for the duration in which the first internal source clock HALF_INT_REFCLK1 and the second internal source clock HALF_INT_REFCLK2 do not have the same logic level.

Furthermore, the level adjuster 3224 included in the level detection block 322 increases the level of the phase correction control voltage PHASE_CORRECT_VOL in response to the deactivation of the signal PHASE_CORRECT_LOGIC outputted from the logic operator 3222, and decreases the level of the phase correction control voltage PHASE_CORRECT_VOL in response to the activation of the signal PHASE_CORRECT_LOGIC outputted from the logic operator 3222.

Therefore, the level detection block 322 increases the level of the phase correction control voltage PHASE_COR- RECT_VOL for the duration in which the first internal source clock HALF_INT_REFCLK1 and the second internal source clock HALF_INT_REFCLK2 have the same logic level, and decreases the level of the phase correction control voltage PHASE_CORRECT_VOL for the duration in which the first internal source clock HALF_INT_REFCLK1 and the second internal source clock HALF_INT_REFCLK2 have the different logic level.

The variable delay block 324 delays the first internal source clock HALF_INT_REFCLK1 by a delay amount, which is more than the current delay amount, or delays the second internal source clock HALF_INT_REFCLK2 by a delay amount, which is less than the current delay amount, in response to the level increase of the phase correction control voltage PHASE_CORRECT_VOL.

On the other hand, the variable delay block 324 delays the first internal source clock HALF_INT_REFCLK1 by a delay amount, which is less than the current delay amount, or delays the second internal source clock HALF_INT_REFCLK2 by a delay amount, which is more than the current delay amount, in response to the level decrease of the phase correction control voltage PHASE_CORRECT_VOL. For example, as shown in FIG. 4, the variable delay block 324 delays the second internal source clock HALF_INT_REFCLK2 in response to the phase correction control voltage PHASE_CORRECT_VOL.

Figure 5A:
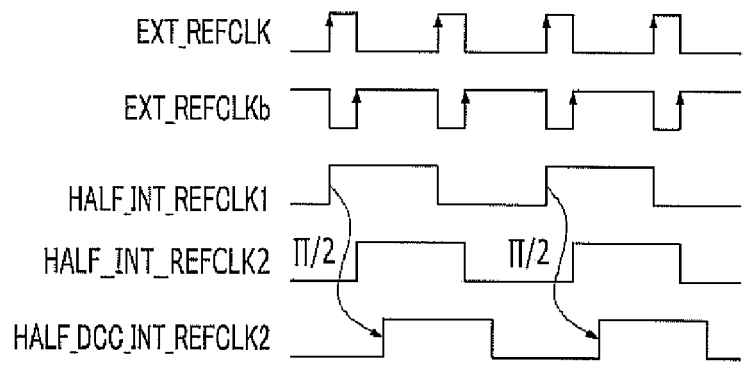
FIG. 5A is a diagram illustrating the operation of the internal source clock generation unit and the clock phase correction unit illustrated in FIG. 4 in accordance with an exemplary embodiment of the present invention.

FIG. 5A is a diagram illustrating the operation of the internal source clock generation unit 300 and the clock phase correction unit 320 illustrated in FIG. 4 in accordance with an exemplary embodiment of the present invention.

Figure 5B:
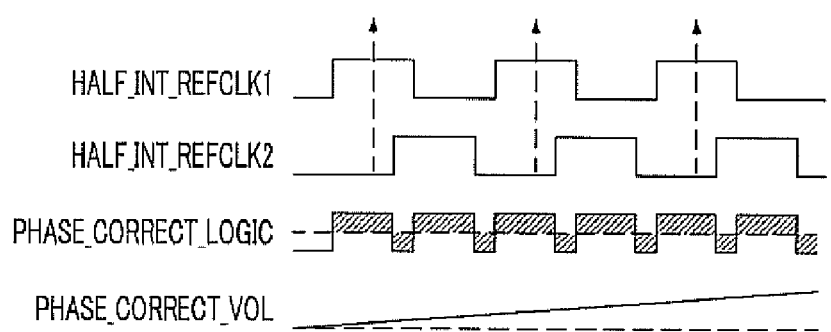
FIG. 5B is a diagram illustrating the decrease of the variable delay amount in the operation of the clock phase correction unit illustrated in FIG. 4 in accordance with an exemplary embodiment of the present invention.

FIG. 5B is a diagram illustrating the decrease of the variable delay amount in the operation of the clock phase correction unit 320 illustrated in FIG. 4 in accordance with an exemplary embodiment of the present invention.

Figure 5C:
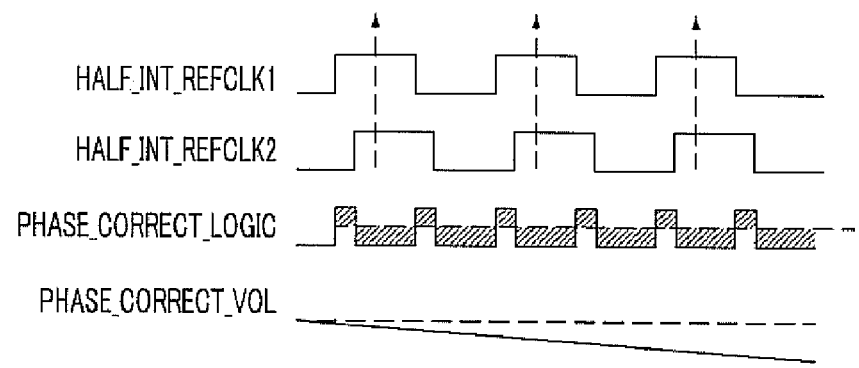
FIG. 5C is a diagram illustrating the increase of the variable delay amount in the operation of the clock phase correction unit illustrated in FIG. 4 in accordance with an exemplary embodiment of the present invention.

FIG. 5C is a diagram illustrating the increase of the variable delay amount in the operation of the clock phase correction unit 320 illustrated in FIG. 4 in accordance with an exemplary embodiment of the present invention.

Figure 5D:
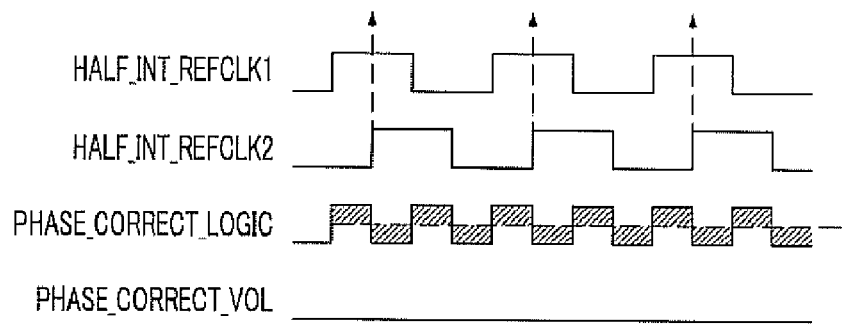
FIG. 5D is a diagram illustrating no variation of the variable delay amount in the operation of the clock phase correction unit illustrated in FIG. 4 in accordance with an exemplary embodiment of the present invention.

FIG. 5D is a diagram illustrating no variation of the variable delay amount in the operation of the clock phase correction unit 320 illustrated in FIG. 4 in accordance with an exemplary embodiment of the present invention.

Referring to FIG. 5A, the activation duration of the external source clock EXT_REFCLK is shorter than the deactivation duration thereof, and thus, the duty cycle ratio is less than 50%. The activation duration of the phase-inverted external source clock EXT_REFCLKb is longer than the deactivation duration thereof, and thus, the duty cycle ratio is greater than 50%.

According to such states, the phase difference between the first internal source clock HALF_INT_REFCLK1 corresponding to the rising edge of the external source clock EXT_REFCLK and the second internal source clock HALF_INT_REFCLK2 corresponding to the falling edge of the external source clock EXT_REFCLK becomes less than 90 degrees. Likewise, the phase difference between the first internal source clock HALF_INT_REFCLK1 corresponding to the falling edge of the phase-inverted external source clock EXT_REFCLKb and the second internal source clock HALF_INT_REFCLK2 corresponding to the rising edge of the phase-inverted external source clock EXT_REFCLKb becomes less than 90 degrees as well.

That is, the internal source clock generation unit 300 performs the operation of generating the first internal source clock HALF_INT_REFCLK1 and the second internal source clock HALF_INT_REFCLK2 whose frequencies are two times less than that of the external source clock EXT_REFCLK.

As illustrated, the clock phase correction unit 320 delays the phase of the second internal source clock HALF_INT_REFCLK2 by a certain amount so that the first internal source clock HALF_INT_REFCLK1 and the second internal source clock HALF_INT_REFCLK2 have a 90-degree phase difference.

In the drawing, the method of varying the phase of the second internal source clock HALF_INT_REFCLK2 is used. However, a method of varying only the phase of the first internal source clock HALF_INT_REFCLK1 or a method of simultaneously varying the phases of the first internal source clock HALF_INT_REFCLK1 and the second internal source clock HALF_INT_REFCLK2 may be used according to a designer's choice.

The operation of the clock phase correction unit 320 in accordance with an exemplary embodiment of the present invention will be described in more detail with reference to FIGS. 5B to 5D.

Referring to FIG. 5B, the phase difference between the first internal source clock HALF_INT_REFCLK1 and the second internal source clock HALF_INT_REFCLK2 is greater than 90 degrees. Thus, in each period, the length of the duration in which the first internal source clock HALF_INT_REFCLK1 and the second internal source clock HALF_INT_REFCLK2 have different logic levels is longer than the is length of the duration in which the first internal source clock HALF_INT_REFCLK1 and the second internal source clock HALF_INT_REFCLK2 have the same logic level.

Therefore, in each period, the length of the duration in which the output signal PHASE_CORRECT_LOGIC of the logic operator 3222 included in the clock phase correction unit 320 maintains the logic high level is longer than the length of the duration in which the output signal PHASE_CORRECT_LOGIC of the logic operator 3222 maintains the logic low level.

Therefore, the voltage level of the phase correction control voltage PHASE_CORRECT_VOL slowly increases, and thus, the variable delay block 324 operates so that the first internal source clock HALF_INT_REFCLK1 and the second internal source clock HALF_INT_REFCLK2 have a 90-degree phase difference.

Referring to FIG. 5C, the phase difference between the first internal source clock HALF_INT_REFCLK1 and the second internal source clock HALF_INT_REFCLK2 is less than 90 degrees. Thus, the length of the duration in which the first internal source clock HALF_INT_REFCLK1 and the second internal source clock HALF_INT_REFCLK2 have the same logic level is longer than the length of the duration in which the first internal source clock HALF_INT_REFCLK1 and the second internal source clock HALF_INT_REFCLK2 have different logic levels.

Therefore, the length of the duration in which the output signal PHASE_CORRECT_LOGIC of the logic operator 3222 included in the clock phase correction unit 320 maintains the logic high level is shorter than the length of the duration in which the output signal PHASE_CORRECT_LOGIC of the logic operator 3222 maintains the logic low level.

Therefore, the voltage level of the phase correction control voltage PHASE_CORRECT_VOL slowly decreases, and thus, the variable delay block 324 operates so that the first internal source clock HALF_INT_REFCLK1 and the second internal source clock HALF_INT_REFCLK2 have a 90-degree phase difference.

Referring to FIG. 5D, the phase difference between the first internal source clock HALF_INT_REFCLK1 and the second internal source clock HALF_INT_REFCLK2 is 90 degrees. Thus, the length of the duration in which the first internal source clock HALF_INT_REFCLK1 and the second internal source clock HALF_INT_REFCLK2 have the same logic level is equal to the length of the duration in which the first internal source clock HALF_INT_REFCLK1 and the second internal source clock HALF_INT_REFCLK2 have different logic levels.

Therefore, the length of the duration in which the output signal PHASE_CORRECT_LOGIC of the logic operator 3222 included in the clock phase correction unit 320 maintains the logic high level is equal to the length of the duration in which the output signal PHASE_CORRECT_LOGIC of the logic operator 3222 maintains the logic low level.

Therefore, the voltage level of the phase correction control voltage PHASE_CORRECT_VOL maintains the current state, and thus, the variable delay block 324 performs no operation. In this case, the first internal source clock HALF_INT_REFCLK1 and the second internal source clock HALF_INT_REFCLK2 continue to have a 90-degree phase difference.

Figure 6:
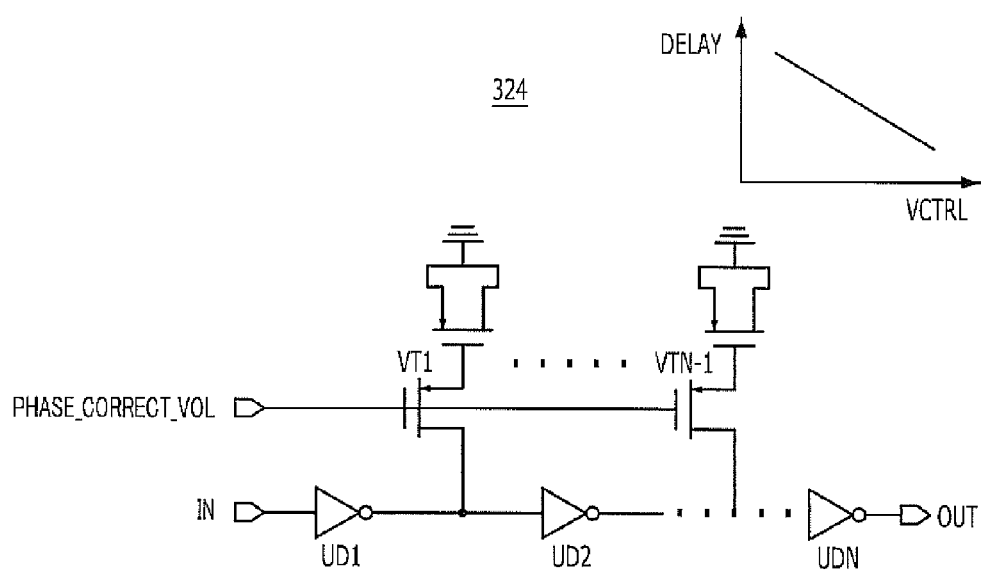
FIG. 6 is a detailed circuit diagram of a variable delay block included in the clock phase correction unit illustrated in FIG. 4 in accordance with an exemplary embodiment of the present invention.

FIG. 6 is a circuit diagram of the variable delay block 324 included in the clock phase correction unit 320 illustrated in FIG. 4 in accordance with an exemplary embodiment of the present invention.

Referring to FIG. 6, the variable delay block 324 includes a plurality of delay units UD1, UD2 . . . UDN, and a plurality of variable-resistor transistors VT1 . . . VTN−1. The delay units UD1, UD2 . . . UDN are coupled in series between a signal input terminal IN and a signal output terminal OUT and have certain delay amounts. The variable-resistor transistors VT1 . . . VTN−1 are coupled to respective nodes between the delay units UD1, UD2 . . . UDN and a ground voltage (VSS) terminal, and have resistances varying depending on the level of the phase correction control voltage PHASE_CORRECT_VOL.

When the level of the phase correction control voltage PHASE_CORRECT_VOL increases, the resistances of the variable-resistor transistors VT1 . . . VTN−1 decrease. Thus, the variable delay block 324 illustrated in FIG. 6 delays the signal inputted through the signal input terminal IN by a delay amount, which is less than the current delay amount, and outputs the delayed signal through the signal output terminal OUT.

On the other hand, when the level of the phase correction control voltage PHASE_CORRECT_VOL decreases, the resistances of the variable-resistor transistors VT1 . . . VTN−1 increase. Thus, the variable delay block 324 illustrated in FIG. 6 delays the signal inputted through the signal input terminal IN by a delay amount, which is greater than the current delay amount, and outputs the delayed signal through the signal output terminal OUT.

Figure 7A:
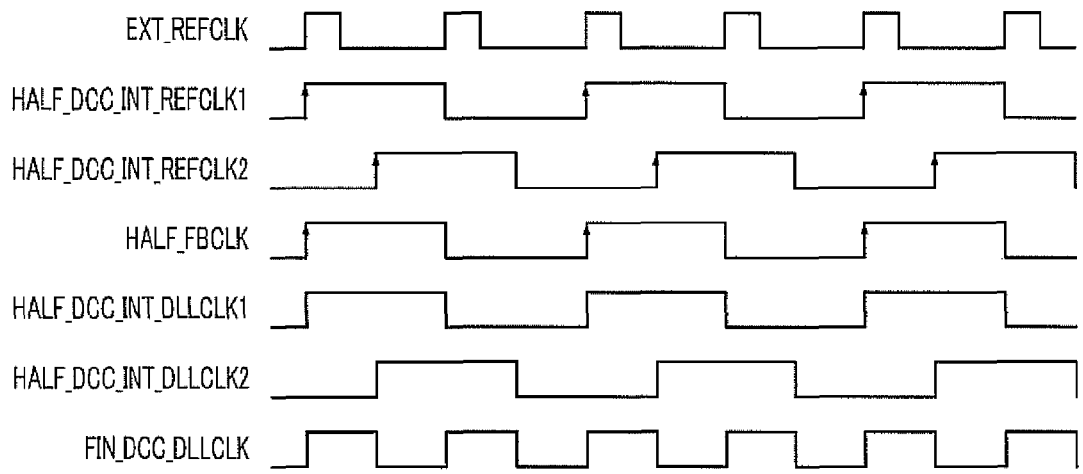
FIG. 7A is a diagram illustrating the operations of the DLL circuit and the DCC circuit illustrated in FIG. 3 in accordance with an in exemplary embodiment of the present invention, which uses a similar phase of the internal source clock and the feedback clock.

FIG. 7A is a diagram illustrating the operations of the DLL circuit and the DCC circuit illustrated in FIG. 3 in accordance with an exemplary embodiment of the present invention, which uses the same phase of the internal source clock and the feedback clock.

Figure 7B:
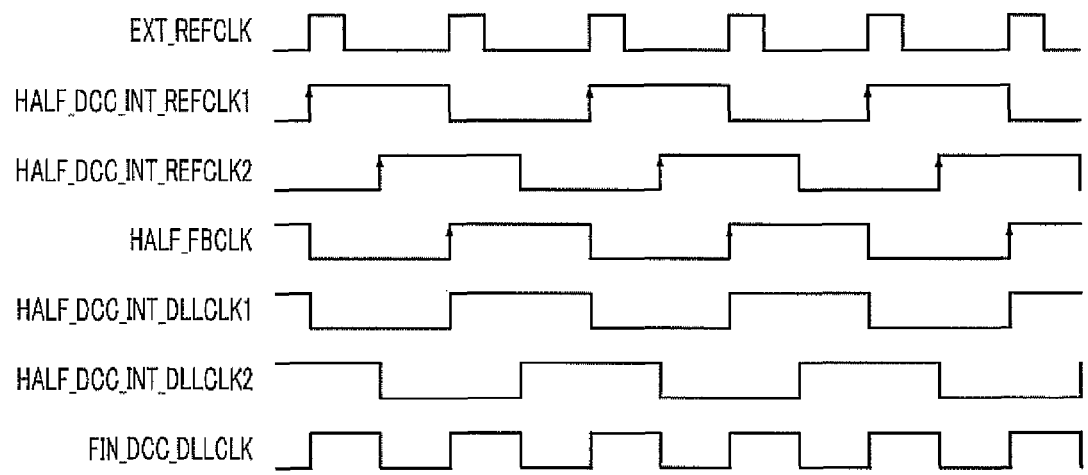
FIG. 7B is a diagram illustrating the operations of the DLL circuit and the DCC circuit illustrated in FIG. 3 in accordance with an exemplary embodiment of the present invention, which uses the opposite phase of the internal source clock and the feedback clock.

FIG. 7B is a diagram illustrating the operations of the DLL circuit and the DCC circuit illustrated in FIG. 3 in accordance with an exemplary embodiment of the present invention, which uses the opposite phase of the internal source clock and the feedback clock.

FIGS. 7A and 7B are waveform diagrams of the input/output signals when the operations of both the DLL circuit and the DCC circuit of the semiconductor device in accordance with exemplary embodiments of the present invention are completed.

Referring to FIG. 7A, the rising edges of the first phase-corrected internal source clock HALF_DCC_INT_REFCLK1, the feedback clock HALF_FBCLK, and the first DLL clock HALF_DCC_DLLCLK1 are synchronized with the rising edge of the external source clock EXT_REFCLK.

At this time, the first phase-corrected internal source clock HALF_DCC_INT_REFCLK1 and the second phase-corrected internal source clock HALF_DCC_INT_REFCLK2 have half the frequency of the external source clock EXT_REFCLK. The second phase-corrected internal source clock HALF_DCC_INT_REFCLK2 is not synchronized with the falling edge of the external source clock EXT_REFCLK and has a 90-degree phase difference from the first phase-corrected internal source clock HALF_DCC_INT_REFCLK1. This phenomenon occurs when the phase of the second phase-corrected internal source clock HALF_DCC_INT_REFCLK2 is varied through the operations of the internal source clock generation unit 300 and the clock phase correction unit 320 performing the DCC operation.

The first DLL clock HALF_DCC_DLLCLK1 is synchronized with the first phase-corrected internal source clock HALF_DCC_INT_REFCLK1, and the second DLL clock HALF_DCC_DLCLK2 is synchronized with the second phase-corrected internal source clock HALF_DCC_INT_REFCLK2. Also, the first DLL clock HALF_DCC_DLLCLK1 and the second DLL clock HALF_DCC_DLLCLK2 having the 90-degree phase difference are mixed, and the period of those clocks is divided by two to generate the final DLL clock FIN_DCC_DLLCLK having a frequency twice as fast. This phenomenon occurs when the phases of the first phase-corrected internal source clock HALF_DCC_INT_REFCLK1 and the second phase-corrected internal source clock HALF_DCC_INT_REFCLK2 are varied through the operations of the clock delay unit 340 and the clock output unit 360 performing the DLL operation.

The difference between FIGS. 7A and 7B is that the feedback clock HALF_FBCLK and the first and second DLL clocks HALF_DCC_DLLCLK1 and HALF_DCC_DLLCLK2 have opposite phases. In spite of this, the final DLL clocks FIN_DCC_DLLCLK in FIGS. 7A and 7B have the same phase. This means that the DLL operation and the DCC operation in accordance with an exemplary embodiment of the present invention may include a frequency-varying operation, and yet the final DLL clock FIN_DCC_DLLCLK can be constant.

As described above, the DLL circuit and the DCC circuit in accordance with an exemplary embodiment of the present invention vary the frequencies in the course of the DLL operation and the DCC operation while receiving the external source clock EXT_REFCLK. Thus, the DLL operation and the DCC operation can be stably performed even when the external source clock EXT_REFCLK having a high frequency is applied.

Hence, the DLL circuit and the DCC circuit in accordance with an exemplary embodiment of the present invention internally perform a low-frequency operation. This means that power dissipated through the DLL operation and the DCC operation can be minimally maintained.

Furthermore, the external source clock EXT_REFCLK is received, and the DCC operation is first performed. Subsequently, the DLL operation is performed. Therefore, the DLL operation can be performed using a single clock path. Consequently, the area occupied by the circuits for the DLL operation in accordance with exemplary embodiments of the present invention can be reduced.

In the exemplary embodiments of the present invention, the DLL operation and the DCC operation are performed by using an internal clock which is generated by dividing the frequency of the external source clock by a certain ratio, and then, the period of the internal clock is divided by a certain ratio to generate the DLL clock having the same frequency as the external source clock. Therefore, even though the external source clock having a high frequency is applied, the DLL circuit and the DCC circuit can be stably performed.

While the present invention has been described with respect to the specific embodiments, it will be apparent to those skilled in the art that various changes and modifications may be made without departing from the spirit and scope of the invention as defined in the following claims.

For example, positions and types of the logic gates and the transistors used herein may be implemented in a different manner, depending on polarities of the signals inputted thereto.

What is claimed is:

1. A semiconductor device comprising:
an internal source clock generation unit configured to divide a frequency of an external source clock by a certain ratio, and to output first and second internal source clocks corresponding to first and second edges of the external source clock;
a clock phase correction unit configured to detect a duration in which the first and second internal source clocks have a same logic level, to correct a phase difference between the first and second internal source clocks according to a detection result, and to output first and second phase-corrected internal source clocks;
a clock delay unit configured to delay the first and second phase-corrected internal source clocks by a delay amount corresponding to a phase difference between the first and second phase-corrected internal source clocks and a feedback clock, and to generate first and second delay locked loop (DLL) clocks; and
a clock output unit configured to mix phases of the first and second DLL clocks to output a final DLL clock, and to output the feedback clock to reflect an actual delay condition of an external source clock path in the first or second DLL clock.

2. The semiconductor device of claim 1, wherein the internal source clock generation unit comprises:
a first clock frequency division block configured to divide the frequency of the external source clock by the certain ratio, and generate the first internal source clock; and
a second clock frequency division block configured to divide a frequency of a phase-inverted external source clock by the certain ratio, and generate the second internal source clock.

3. The semiconductor device of claim 1, wherein the clock phase correction unit comprises:
a level detection block configured to detect a duration in which the first and second internal source clocks have the same logic level, and vary a level of a phase correction control voltage in response to the detection result; and
a variable delay block configured to delay the first or second internal source clock by a delay amount, which varies depending on a is level change of the phase correction control voltage, and output the first and second phase-corrected internal source clocks.

4. The semiconductor device of claim 3, wherein the level detection block is configured to increase the level of the phase correction control voltage for the duration in which the first and second internal source clocks have the same logic level, and to decrease the level of the phase correction control voltage for a duration in which the first and second internal source clocks have different logic levels.

5. The semiconductor device of claim 4, wherein the variable delay block is configured to delay the first internal source clock by a delay amount, which increases in response to a level increase of the phase correction control voltage, or delay the second internal source clock by a delay amount, which decreases in response to the level increase of the phase correction control voltage, and
the variable delay block is configured to delay the first internal source clock by a delay amount, which decreases in response to a level decrease of the phase correction control voltage, or delay the second internal source clock by a delay amount, which increases in response to the level decrease of the phase correction control voltage.

6. The semiconductor device of claim 3, wherein the level detection block comprises:
a logic operator configured to receive the first internal source clock through a first input terminal and the second internal source clock through a second input terminal, and perform an exclusive OR operation on the first internal source clock and the second internal source clock; and
a level adjuster configured to adjust a voltage level of the phase correction control voltage according to a logic level change of a signal outputted from the logic operator.

7. The semiconductor device of claim 3, wherein the variable delay block comprises:
a plurality of delay units coupled in series between a signal input terminal and a signal output terminal and having certain delay amounts; and
a plurality of variable-resistor transistors coupled between respective nodes between the delay units and a ground voltage terminal and having resistances varying depending on the level of the phase correction control voltage.

8. The semiconductor device of claim 1, wherein the clock delay unit comprises:
a phase comparison block configured to compare a phase of one of the first and second phase-corrected internal source clock with a phase of the feedback clock;
a first clock delay line configured to generate the first DLL clock by delaying the first phase-corrected internal source clock by a delay amount which varies depending on an output signal of the phase comparison block; and
a second clock delay line configured to generate the second DLL clock by delaying the second phase-corrected internal source clock by a delay amount which varies depending on the output signal of the phase comparison block.

9. The semiconductor device of claim 8, wherein the clock delay unit further comprises a dummy phase comparison block coupled to an output terminal of the other clock of the first and second phase-corrected internal source clocks, and configured to apply a same load to the first or second phase-corrected internal source clocks, as that of the phase comparison block.

10. The semiconductor device of claim 1, wherein the clock output unit comprises:
a DLL clock generation block configured to generate the final DLL clock whose logic level transition timing is determined corresponding to a duration in which the first DLL clock and the second DLL clock have a same logic level and a duration in which the first DLL clock and the second DLL clock have different logic levels; and a feedback clock generation block to generate the feedback clock by modeling the actual delay condition of a path from the external source clock to a clock generated by dividing a frequency of the final DLL clock, in which the phases of the first DLL clock and the second DLL clocks are mixed, by a certain ratio.

11. The semiconductor device of claim 1, wherein the clock output unit comprises:

a DLL clock generation block configured to generate the final DLL clock whose logic level transition timing is determined corresponding to a duration in which the first DLL clock and the second DLL clock have a same logic level and a duration in which the first DLL clock and the second DLL clock have different logic levels; and a feedback clock generation block configured to generate the feedback clock to reflect the actual delay condition of the external source clock path in one of the first DLL clock and the second DLL clock.

12. The semiconductor device of claim 10, wherein the DLL clock generation block is configured to deactivate the final DLL clock for the duration in which the first DLL clock and the second DLL clock have the same logic level, and to activate the final DLL clock for the duration in which the first DLL clock and the second DLL clock have the different logic levels.

13. The semiconductor device of claim 10, wherein the DLL clock generation block comprises an exclusive OR (XOR) gate configured to receive the first DLL clock through a first input terminal and the second DLL clock through a second input terminal, perform an XOR operation on the first DLL clock and the second DLL clock, and output the final DLL clock.

14. A semiconductor device comprising:

a phase correction unit configured to divide frequencies of first and second internal source clocks corresponding to first and second edges of an external source clock by two, and perform a phase correction operation so that the first and second internal source clocks have a 90-degree phase difference;

a clock delay unit configured to generate first and second delay locked loop (DLL) clocks by delaying the first and second internal source clocks by a delay amount corresponding to a phase difference between the first or second internal source clock and a feedback clock; and a clock output unit configured to output a final DLL clock by dividing a frequency of the first DLL clock by two, or by dividing a frequency of the second DLL clock by two, and output the feedback clock to reflect an actual delay condition of an external source clock path in the first or second DLL clock.

15. The semiconductor device of claim 14, wherein the phase correction unit comprises:

a first clock frequency division block configured to divide the frequency of the external source clock by two to output the first internal source clock corresponding to the first edge of the external source clock;

a second clock frequency division block configured to divide the frequency of the external source clock by two to output the second internal source clock corresponding to the second edge of the external source clock;

a phase difference detection block configured to detect whether the first and second internal source clocks have the 90-degree phase difference; and a variable delay block configured to delay the first or second internal source clock by a delay amount which varies depending on a detection result of the phase difference detection block.

16. The semiconductor device of claim 15, wherein the phase difference detection block determines that the first and second internal source clocks have a phase difference greater than 90 degrees when a length of a first duration in which the first internal source clock and the second internal source clock have different logic levels is longer than a length of a second duration in which the first internal source clock and the second internal source clock have a same logic level, the phase difference detection block determines that the first and second internal source clocks have a phase difference less than the 90 degrees when the length of the first duration is shorter than the length of the second duration, and the phase difference detection block determines that the first and second internal source clocks have the 90-degree phase difference when the length of the first duration is equal to the length of the second duration.

17. The semiconductor device of claim 16, wherein the variable delay block increases the delay amount of the first internal source clock or decreases the delay amount of the second internal source clock, when it is determined that the first internal source clock and the second internal source clock have the phase difference greater than the 90 degrees, the variable delay block decreases the delay amount of the first internal source clock or increases the delay amount of the second internal source clock, when it is determined that the first internal source clock and the second internal source clock have the phase difference less than the 90 degrees, and the variable delay block maintains the delay amount of the first internal source clock and the second internal source clock, when it is determined that the first internal source clock and the second internal source clock have the 90-degree phase difference.

18. The semiconductor device of claim 14, wherein the clock delay unit comprises:

a phase comparison block configured to compare a phase of one of the first and second internal source clocks with a phase of the feedback clock;

a first clock delay line configured to output the first DLL clock by delaying the first internal source clock by a delay amount which varies in response to an output signal of the phase comparison block; and a second clock delay line configured to output the second DLL clock by delaying the second internal source clock by a delay amount which varies in response to the output signal of the phase comparison block.

19. The semiconductor device of claim 18, wherein the clock delay unit further comprises a dummy phase comparison block coupled to an output terminal of the other clock of the first and second internal source clocks, and configured to apply a same load to the first or second phase-corrected internal source clocks.

20. The semiconductor device of claim 14, wherein the clock output unit comprises:

a DLL clock generation block configured to generate the final DLL clock having a same frequency as the external source clock by activating and deactivating the final DLL clock at respective edges of the first and second DLL clocks, or by deactivating and activating the final DLL clock at respective edges of the first and second DLL clocks; and a feedback clock generation block configured to generate the feedback clock to reflect the actual delay condition of the external source clock path in a clock which is generated by dividing the frequency of the final DLL clock, in which the phases of the first and second DLL clocks are mixed, by two.

21. The semiconductor device of claim 14, wherein the clock output unit comprises:
a DLL clock generation block configured to generate the final DLL clock having a same frequency as the external source clock by activating and deactivating the final DLL clock at respective edges of the first and second DLL clocks, or by deactivating and activating the final DLL clock at respective edges of the first and second DLL clocks; and
a feedback clock generation block configured to generate the feedback clock to reflect the actual delay condition of the external source clock path in one of the first DLL clock and the second DLL clock.

22. A method for operating a semiconductor device, the method comprising:
dividing a frequency of a clock corresponding to a first edge of an external source clock at a certain ratio, and outputting a first internal source clock;
dividing a frequency of a clock corresponding to a second edge of the external source clock at the certain ratio, and outputting a second internal source clock;
correcting a phase of the first or second internal source clock so that a length of a first duration in which the first and second internal source clocks have a same logic level is equal to a length of a second duration in which the first and second internal source clocks have different logic levels;
generating first and second delay locked loop (DLL) clocks by delaying the first and second internal source clocks by a delay amount in corresponding to a phase difference between the first or second internal source clock and a feedback clock;
generating a final DLL clock whose logic level transition timing is determined corresponding to edges of the first and second DLL clocks; and
outputting the feedback clock to reflect an actual delay condition of an external source clock path in the first or second DLL clock.

23. The method of claim 22, wherein, when the length of the second duration is longer than the length of first the duration, the correcting of the phase of the first or second internal source clock comprises:
increasing the phase of the first internal source clock;
decreasing the phase of the second internal source clock; and
increasing the phase of the first internal source clock and decreasing the phase of the second internal source clock.

24. The method of claim 23, wherein, when the length of the second duration is shorter than the length of the first duration, the correcting of the phase of the first or second internal source clock comprises:
decreasing the phase of the first internal source clock;
increasing the phase of the second internal source clock; and
decreasing the phase of the first internal source clock and increasing the phase of the second internal source clock.

25. The method of claim 22, wherein the generating of the final DLL clock comprises:

generating the final DLL clock which changes to an activated state at the edge of the first DLL clock and changes to a deactivated state at the edge of the second DLL clock; and
generating the final DLL clock which changes to a deactivated state at the edge of the first DLL clock and changes to an activated state at the edge of the second DLL clock.

26. The method of claim 22, wherein the outputting of the feedback clock comprises:
outputting the feedback clock to reflect the actual delay condition of the external source clock path in the first DLL clock;
outputting the feedback clock to reflect the actual delay condition of the external source clock path in the second DLL clock; and
outputting the feedback clock to reflect the actual delay condition of the external source clock path to a clock which is generated by dividing the frequency of the final DLL clock, in which the first and second DLL clocks are mixed, at the certain ratio.

27. A semiconductor device comprising:
a delay locked loop (DLL) operation unit configured to divide frequencies of first and second internal source clocks, corresponding to first and second edges of an external source clock, by two, perform a phase correction operation so that first and second frequency-divided internal source clocks have a 90-degree phase difference, and delay first and second phase-corrected internal source clocks by a variable delay amount corresponding to a DLL control signal; and
a DLL operation control unit configured to output a DLL clock by dividing periods of first and second variably-delayed internal source clocks by two, and adjust a value of the DLL control signal according to a phase difference between a feedback clock and the first or second phase-corrected internal source clock, the feedback clock being generated to reflect an actual delay condition of an external source clock path in the first or second variably-delayed internal source clock.

28. The semiconductor device of claim 27, wherein the DLL operation unit comprises:
a clock frequency division block configured to divide the frequencies of the first and second internal source clocks by two, and output the first and second frequency-divided internal source clocks;
a phase correction block configured to correct a phase of the first or second frequency-divided internal source clock in order for the first and second frequency-divided internal source clocks to have the 90-degree phase difference, and output the first and second phase-corrected internal source clocks; and
a clock delay block configured to delay the first and second phase-corrected internal source clocks by a delay amount which varies depending on the DLL control signal.

29. The semiconductor device of claim 28, wherein the phase correction block comprises:
a phase difference detector configured to detect whether the first and second frequency-divided internal source clocks have the 90-degree phase difference; and
a variable delay configured to delay the phase of the first or second frequency-divided internal source clock by a delay amount which varies depending on a detection result of the phase difference detector, and output the first and second phase-corrected internal source clocks.

30. The semiconductor device of claim 29, wherein the phase difference detector determines that the first and second frequency-divided internal source clocks have a phase difference greater than 90 degrees when a length of a first duration in which the first and second frequency-divided internal source clock have different logic levels is longer than a length of a second duration in which the first and second frequency-divided internal source clocks have a same logic level, the phase difference detector determines that the first and second frequency-divided internal source clocks have a phase difference less than 90 degrees when the length of the first duration is shorter than the length of the second duration, and the phase difference detector determines that the first and second frequency-divided internal source clocks have the 90-degree phase difference when the length of the first duration is equal to the length of the second duration.

31. The semiconductor device of claim 30, wherein the variable delay increases the delay amount of the first frequency-divided internal source clock or decreases the delay amount of the second internal source clock, when it is determined that the first and second frequency-divided internal source clocks have a phase difference greater than the 90 degrees, the variable delay decreases the delay amount of the first internal source clock or increases the delay amount of the second internal source clock, when it is determined that the first and second frequency-divided internal source clocks have a phase difference less than the 90 degrees, and the variable delay maintains the delay of the first and second frequency-divided internal source clock, when it is determined that the first and second frequency-divided internal source clocks have the 90-degree phase difference.

32. The semiconductor device of claim 27, wherein the DLL operation control unit comprises:

a DLL clock generation block configured to generate the DLL clock having a same frequency as the external source clock by activating and deactivating the DLL clock at respective edges of the first and second variably-delayed clocks, or by deactivating and activating the DLL clock at respective edges of the first and second variably-delayed clocks;

a feedback clock generation block configured to generate the feedback clock to reflect the actual delay condition of the external source clock path in a clock which is generated by dividing the frequency of the DLL clock by two; and a phase comparison block configured to determine the value of the DLL control signal by comparing a phase of one of the first and second phase-corrected internal source clocks with a phase of the feedback clock.

33. The semiconductor device of claim 27, wherein the DLL operation control unit comprises:

a DLL clock generation block configured to generate the DLL clock having a same frequency as the external source clock by activating and deactivating the DLL clock at respective edges of the first and second variably-delayed clocks, or by deactivating and activating the DLL clock at respective edges of the first and second variably-delayed clocks;

a feedback clock generation block configured to generate the feedback clock to reflect the actual delay condition of the external source clock path in the first or second variably-delayed clocks; and a phase comparison block configured to determine the value of the DLL control signal by comparing a phase of the first or second phase-corrected internal source clocks with a phase of the feedback clock.

34. The semiconductor device of claim 32, wherein the DLL operation control unit further comprises a dummy phase comparison block coupled to an output terminal of the other clock of the first and second phase-corrected internal source clocks, and configured to apply a same load to the first or second phase-corrected internal source clocks, as that of the phase comparison block.

35. A semiconductor device comprising:

an internal source clock generation unit configured to generate first and second internal source clocks;

a clock phase correction unit configured to correct a phase difference between the first and second internal source clocks, and to output first and second phase-corrected internal source clocks;

a clock delay unit configured to delay the first and second phase-corrected internal source clocks and to generate first and second delay locked loop (DLL) clocks; and a clock output unit configured to mix phases of the first and second DLL clocks to output a final DLL clock, and to output a feedback clock to reflect an actual delay condition of an external source clock path in the first or second DLL clock.

36. A semiconductor device comprising:

a clock generation unit configured to generate internal source clocks having a certain phase difference by correcting a duty cycle ratio of an external source clock;

a clock delay unit configured to delay the internal source clocks based on a comparison result of the internal source clocks and a feedback clock to generate delay locked loop (DLL) clocks maintained in the certain phase difference; and a clock output unit configured to output a final DLL clock by mixing the DLL clocks and to output the feedback clock to reflect an actual delay condition of an external source clock path in the DLL clocks.

37. The semiconductor device of claim 36, wherein the clock generation unit comprises:

an internal source clock generation unit configured to generate first and second clocks, corresponding to first and second edges of the external source clock, by dividing a frequency of the external source clock by a certain ratio; and a clock phase correction unit configured to detect a duration in which the first and second clocks have a same logic level and output the internal source clocks by correcting a phase difference between the first and second clocks according to a detection result.

38. The semiconductor device of claim 37, wherein the clock output unit is configured to output the final DLL clock by dividing a period of the DLL clocks by the certain ratio and output the feedback clock to reflect the actual delay condition of the external source clock path in a clock generated by dividing the frequency of the final DLL clock by the certain ratio.

39. The semiconductor device of claim 36, wherein the clock delay unit is configured to perform a DLL operation through a single clock path.

* * * * *